United States Patent
Yang

(10) Patent No.: US 6,667,535 B2
(45) Date of Patent: Dec. 23, 2003

(54) FUSE STRUCTURE

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/349,731

(22) Filed: Jan. 22, 2003

(65) Prior Publication Data

US 2003/0122217 A1 Jul. 3, 2003

Related U.S. Application Data

(62) Division of application No. 10/081,337, filed on Feb. 22, 2002.

(30) Foreign Application Priority Data

Dec. 28, 2001 (TW) ........................................ 90133025 A

(51) Int. Cl.⁷ .............................................. H01L 29/00
(52) U.S. Cl. ...................................... 257/529; 257/758
(58) Field of Search ................................. 257/529, 758

(56) References Cited

U.S. PATENT DOCUMENTS 6,522,021 B2 * 2/2003 Sakihama et al. .......... 257/784

2002/0063305 A1   5/2002   Koike .......................... 257/529
2002/0100956 A1   8/2002   Brintzinger et al. ........ 257/529

* cited by examiner

*Primary Examiner*—Mark V. Prenty
(74) *Attorney, Agent, or Firm*—Ladas & Parry

(57) ABSTRACT

A novel fuse structure. An optimal position of laser spot is defined above a substrate. A first conductive layer is formed on part of the substrate. A first dielectric layer is formed on the substrate and the first conductive layer. A second conductive layer as formed on the first dielectric layer. A second dielectric layer is formed on the first dielectric layer and the second conductive layer. A third conductive layer comprising the position of laser spot is formed on part of the second dielectric layer. A plurality of first conductive plugs penetrate the first dielectric layer, to electrically connect the first conductive layer and the second conductive layer. At least one second conductive plug penetrates the second dielectric layer, to electrically connect the second conductive layer and the third conductive layer. Thus, the first conductive layer serves as a backup conductive layer when the second conductive layer is broken.

10 Claims, 5 Drawing Sheets

FUSE STRUCTURE

This is a divisional of U.S. Ser. No. 10/081,337 filed on Feb. 22, 2002.

BACKGROUND OF THE INVENTION

1. Field of the Invention

The present invention relates to a fuse structure used in an integrated circuit device, and more particularly, to a novel fuse structure having a backup conductive layer.

2. Description of the Related Art

Fuses are routinely used in the design of monolithic integrated circuits (IC), and in particular in memory devices as elements for altering the configuration of the circuitry contained therein. As such, memories are commonly built with programmed capabilities wherein fuses are selectively "blown" by, e.g., a laser beam.

It is well known that random access memories (RAM) are designed with redundancies which include spare columns, rows, or even fully functional arrays, wherein when any of these spare elements fails, the defective row, column and the like are replaced by a corresponding element. Disabling and enabling of spare elements is accomplished by fuses which are blown (i.e., melted away) when required, preferably, by a laser beam.

Additionally, the technique of laser fuse deleting (trimming) has been widely used both in the memory and logic IC fabrication industries, as an effective way to improve functional yields and to reduce development cycle time. Yet, fuse blow yield and fuse reliability have been problematic in most conventional fuse designs.

FIG. 1 is a sectional view of a traditional fuse structure. FIG. 2 is a top view of a traditional fuse structure. And FIG. 1 shows the cross section C–C' of FIG. 2.

Referring to FIG. 1, symbol 100 shows an insulated layer substrate. A metal layer M0 is formed on part of the substrate 100. An oxide layer 120 is formed on the metal layer M0 and part of the substrate 100. A metal layer M1 having an optimal position of laser spot 110 is formed on part of the oxide layer 120. At least one conductive plug 130 is defined through the oxide layer 120, for electrically connecting the M0 layer and the M1 layer. A fuse window 140 is formed above part of the M1 layer comprising the position 110 and part of the oxide layer 120. Symbol 150 shows a passivation layer.

In FIG. 2, there are plural fuse structures 210, 220, 230 in the fuse window 140. Each fuse structure 210, 220, 230 comprises the M0 layer, the plug 130 and the M1 layer. The solid line area shows the M1 layer, the dash line area shows the M0 layer, and each structure 210, 220, 230 comprises its own optimal position of laser spot 110. To give an example, a laser beam 290 blows the position 110 of the fuse structure 220. Because of misalignment of the laser beam 290 or thermal scattering of the laser beam 290, thermal shock from the laser blow process can damage the M0 layer of the fuse structures 210, 230, located near the fuse structure 220. This can cause the fuse structures 210, 230 to crack, seriously affecting device reliability and yield.

SUMMARY OF THE INVENTION

An object of the present invention is to provide a novel fuse structure. An optimal position of laser spot is defined above a substrate. A first conductive layer is formed on part of the substrate. A first dielectric layer is formed on the substrate and the first conductive layer. A second conductive layer is formed on the first dielectric layer. A second dielectric layer is formed on the first dielectric layer and the second conductive layer. A third conductive layer comprising the position of laser spot is formed on part of the second dielectric layer. A plurality of first conductive plugs penetrate the first dielectric layer, to electrically connect the first conductive layer and the second conductive layer. At least one second conductive plug penetrates the second dielectric layer, to electrically connect the second conductive layer and the third conductive layer.

The present invention improves on the prior art in that the first conductive layer, serving as a backup conductive layer, is placed under the second conductive layer. Thus, the invention can prevent the fuse structure from failing when both misalignment of the laser beam and thermal scattering of the laser beam damage the second layer of the fuse structure in the laser blow process, raises reliability and yield, and ameliorates the disadvantages of the prior art.

BRIEF DESCRIPTION OF THE DRAWINGS

The present invention can be more fully understood by reading the subsequent detailed description in conjunction with the examples and references made of the accompanying drawings, wherein:

FIG. 1 shows the cross section C–C' of FIG. 2;

FIG. 3 shows the cross section D–D' of FIG. 4;

DETAILED DESCRIPTION OF THE PREFERRED EMBODIMENT

Figure 1:
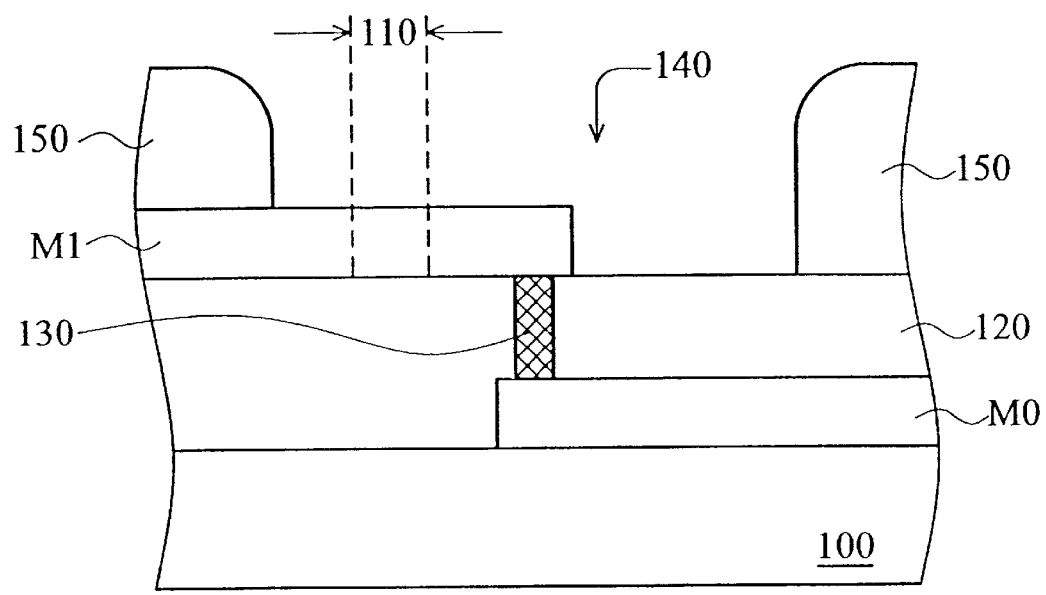
FIG. 1 is a sectional view of the fuse structure of the prior art.
Figure 2:
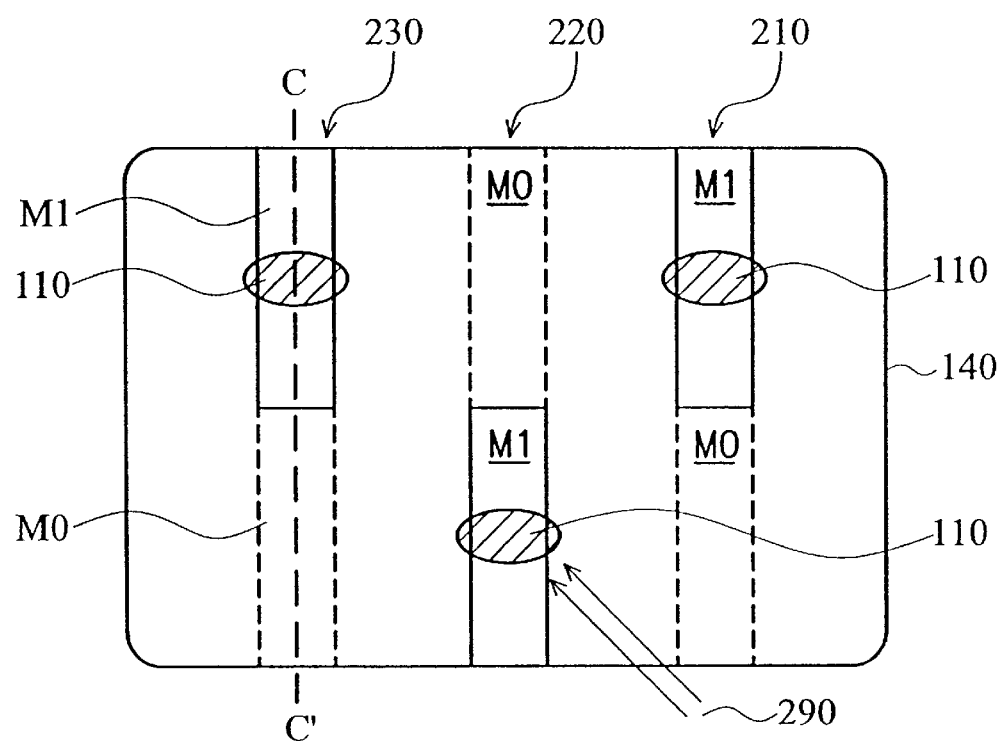
FIG. 2 is a top view of the fuse structure of the prior art.
Figure 3:
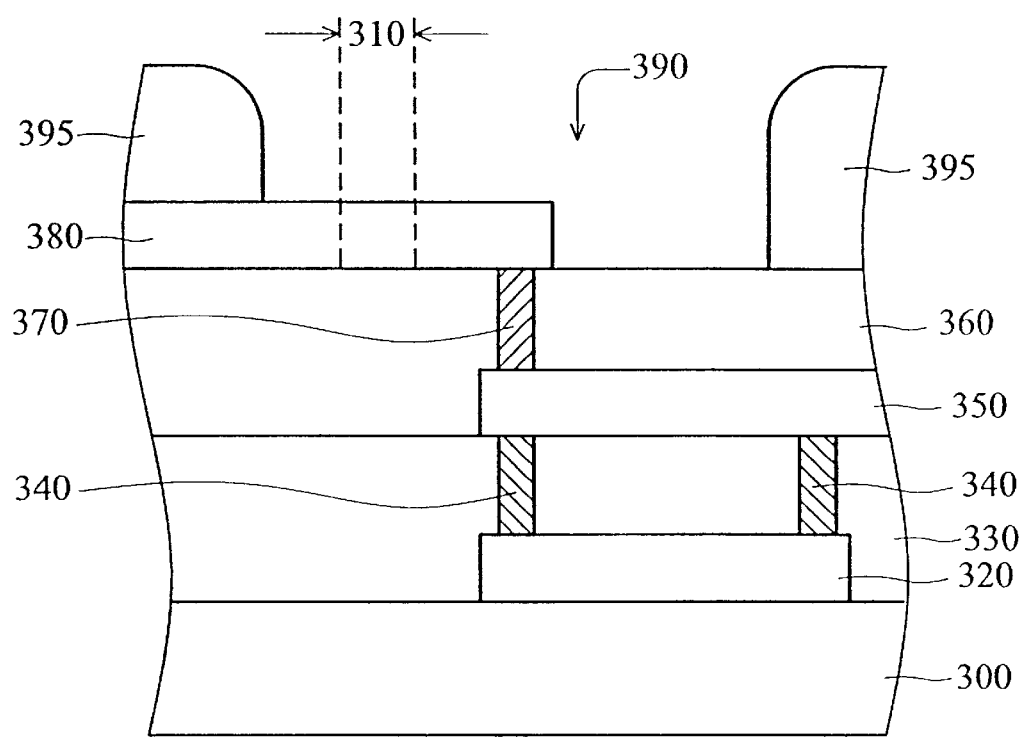
FIG. 3 is a sectional view of the fuse structure in the embodiment of the present invention.
Figure 4:
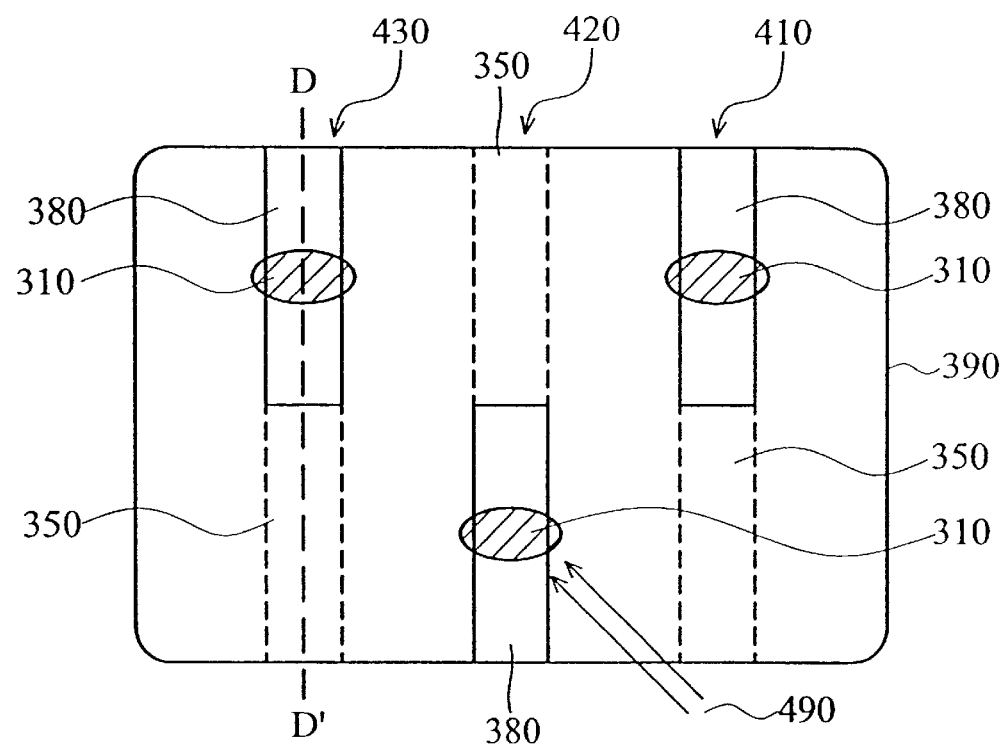
FIG. 4 is a top view of the fuse structure in the embodiment of the present invention.

A fuse structure of the embodiment is shown with reference to FIGS. 3–4. FIG. 3 is a sectional view of the fuse structure in the embodiment of the present invention. FIG. 4 is a top view of the fuse structure in the embodiment of the present invention, and FIG. 3 shows the cross section D–D' of FIG. 4.

Referring to FIG. 3, an optimal position of laser spot 310 is defined above an insulated substrate 300. A first conductive layer 320 is formed on the partial surface of the substrate 300. Then, a first dielectric layer 330 is formed on the substrate 300 and the first conductive layer 320. The material of the substrate 300 may be $SiO_2$. The material of the first conductive layer 320 may be tungsten (W) or poly-silicon. The material of the first dielectric layer 330 may be $SiO_2$.

In FIG. 3, a second conductive layer 350 is formed on part of the first dielectric layer 330. The material of the second conductive layer 350 may be tungsten (W). The first conductive layer 320 under the second conductive layer 350 is preferred since the second conductive layer 350 can protect the first conductive layer 320 from damage in the laser blow process.

In FIG. 3, a plurality of the first plugs 340, 340 penetrate the first dielectric layer 330, to electrically connect the first conductive layer 320 and the second conductive layer 350. The material of the first plugs 340, 340 may be tungsten (W).

In FIG. 3, a second dielectric layer 360 is formed on the second conductive layer 350 and the first dielectric layer 330. The material of the second dielectric layer 360 may be SiO₂.

In FIG. 3, a third conductive layer 380 comprising the position of laser spot 310 is formed on part of the second dielectric layer 360. The material of the third conductive layer 380 may be Al, AlSiCu alloy or poly-silicon.

In FIG. 3, at least one second conductive plug 370 penetrates the second dielectric layer 360, to electrically connect the second conductive layer 350 and the third conductive layer 380. The material of the plug 370 may be tungsten (W).

Moreover, referring to FIG. 3, a passivation layer 395 having a fuse window 390 is formed on the third conductive layer 380 and the second dielectric layer 360. The fuse window 390 exposes the third conductive layer 380 comprising the position of laser spot 310 and part of the second dielectric layer 360. The material of the passivation layer 395 may be PSG, BPSG or photo-resist.

FIG. 4 is a top view of the fuse structure in the embodiment of the present invention, and FIG. 3 shows the cross section D–D' of FIG. 4. Generally, plural fuse structures 410, 420, 430 are formed in the fuse window 390, and do not electrically connect with one another. Any of fuse structures 410, 420, 430 comprises the first conductive layer 320, the first conductive plugs 340, the second conductive layer 350, the second conductive plug 370 and the third conductive layer 380. Each of the fuse structures 410, 420, 430 has its own position of laser spot 310 on the third conductive layer 380. The laterals of the third conductive layer 380 having the position of laser spot 310 of any the fuse structures 410, 420, 430 correspond to the second conductive layer 350 of the adjoining fuse structure. The first conductive layer 320 in FIG. 3 serves as a backup conductive layer when the second conductive layer fails.

Figure 5:
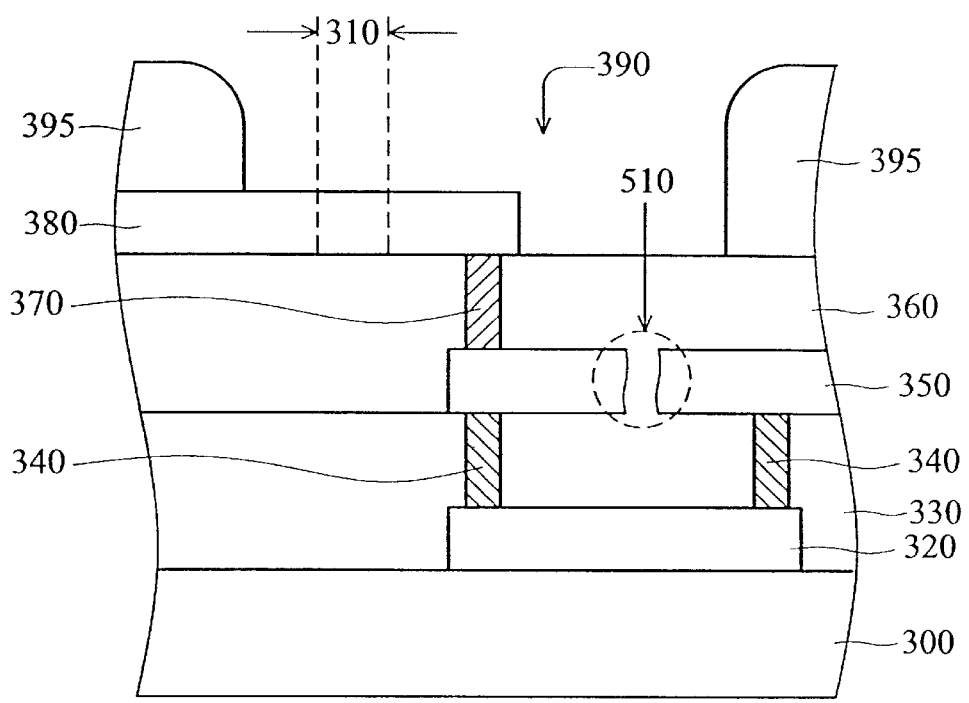
FIG. 5 is a function illustrating view of the fuse structure of the present invention.

For example, referring to FIG. 4 and FIG. 5, in laser blow process 490, when the second conductive layer 350 is broken, a broken area 510 as shown in FIG. 5 is formed. Thus, the first conductive layer 320 serves as a backup conductive layer to electrically connect the third conductive layer 380 and the second conductive layer 350 via the first conductive plugs 340,340 and the second conductive plug 370. This prevents the fuse structure from failing when the second conductive layer 350 is broken, and enhances device reliability and yield.

Finally, while the invention has been described by way of example and in terms of the above preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A fuse structure, comprising:
   an optimal position of laser spot defined above a substrate;
   a first conductive layer formed on part of the substrate;
   a first dielectric layer formed on the substrate and the first conductive layer;
   a second conductive layer formed on the first dielectric layer, wherein the first conductive layer is located under the second conductive layer, thereby protecting the first conductive layer from damage during a laser blow process;
   a second dielectric layer formed on the first dielectric layer and the second conductive layer;
   a third conductive layer comprising the position of laser spot formed on part of the second dielectric layer;
   a plurality of first conductive plugs penetrating the first dielectric layers to electrically connect the first conductive layer and the second conductive layer; and
   at least one second conductive plug penetrating the second dielectric layer, to electrically connect the second conductive layer and the third conductive layer, wherein the first conductive layer serves as a backup conductive layer to electrically connect the third conductive layer and the second conductive layer via the first conductive plugs and the second conductive plug when the second conductive layer is broken during the laser blow process.

2. The fuse structure according to claim 1, wherein the material of the first conductive layer is tungsten or poly-silicon.

3. The fuse structure according to claim 1, wherein the material of the second conductive layer is tungsten.

4. The fuse structure according to claim 1, wherein the material of the third conductive layer is Al, AiSiCa alloy or poly-silicon.

5. The fuse structure according to claim 1, wherein the material of the first dielectric layer is SiO₂.

6. The fuse structure according to claim 1, wherein the material of the second dielectric layer is SiC₂.

7. The fuse structure according to claim 1, wherein the material of the first conductive plug is tungsten.

8. The fuse structure according to claim 1, wherein the material of the second conductive plug is tungsten.

9. The fuse structure according to claim 1, further comprising a passivation layer having a window formed on the third conductive layer and the second dielectric layer;
   wherein the window exposes the third conductive layer comprising the position of laser spot and part of the second dielectric layer.

10. The fuse structure according to claim 9, wherein the material of the passivation layer is PSG BPSG or photo-resist.

* * * * *